United States Patent
Nagamoto et al.

(10) Patent No.: US 9,303,308 B2
(45) Date of Patent: Apr. 5, 2016

(54) ZINC OXIDE-BASED CONDUCTIVE MULTILAYER STRUCTURE, PROCESS FOR PRODUCING THE SAME, AND ELECTRONIC DEVICE

(75) Inventors: Koichi Nagamoto, Tokyo (JP); Takeshi Kondo, Tokyo (JP); Yumiko Amino, Tokyo (JP); Satoshi Naganawa, Tokyo (JP); Tetsuya Yamamoto, Kochi (JP); Takahiro Yamada, Kochi (JP)

(73) Assignees: LINTEC CORPORATION, Tokyo (JP); KOCHI UNIVERSITY OF TECHNOLOGY, Kochi (JP)

( * ) Notice: Subject to any disclaimer, the term of this patent is extended or adjusted under 35 U.S.C. 154(b) by 535 days.

(21) Appl. No.: 13/696,653

(22) PCT Filed: May 11, 2011

(86) PCT No.: PCT/JP2011/060838
§ 371 (c)(1),
(2), (4) Date: Nov. 7, 2012

(87) PCT Pub. No.: WO2011/142382
PCT Pub. Date: Nov. 17, 2011

(65) Prior Publication Data
US 2013/0052458 A1  Feb. 28, 2013

(30) Foreign Application Priority Data
May 14, 2010  (JP) .................................. 2010-112580

(51) Int. Cl.
*B32B 15/04* (2006.01)
*C23C 14/08* (2006.01)
(Continued)

(52) U.S. Cl.
CPC ............... *C23C 14/086* (2013.01); *C08J 7/045* (2013.01); *G06F 3/041* (2013.01); *C08J 2367/02* (2013.01); *C08J 2433/08* (2013.01); *G06F 2203/04103* (2013.01); *Y10T 428/265* (2015.01)

(58) Field of Classification Search
USPC ......... 428/426, 428, 432, 688, 689, 697, 699, 428/701, 702
See application file for complete search history.

(56) References Cited

U.S. PATENT DOCUMENTS 7,534,500 B2   5/2009  Kobayashi et al.
2003/0207093 A1  11/2003  Tsuji et al.
(Continued)

FOREIGN PATENT DOCUMENTS

CN  1565036  1/2005
CN  101542639  9/2009
(Continued)

OTHER PUBLICATIONS

Yamamoto (JP2008226641) English machine translation, Aug. 25, 2008.*
(Continued)

*Primary Examiner* — Lauren Colgan
(74) *Attorney, Agent, or Firm* — Young & Thompson

(57) ABSTRACT

A zinc-oxide-based conductive stacked structure 1 includes a substrate 11 and, formed on at least one surface of the substrate, an undercoat layer 12 and a transparent conductive film 13. The transparent conductive film is formed of a plurality of transparent conductive layers formed from a zinc-oxide-based conductive material and has a carrier density of $2.0 \times 10^{20}$ to $9.8 \times 10^{20}$ cm$^{-3}$. The zinc-oxide-based conductive stacked structure exhibits a change ratio in sheet resistivity of 50 or less, after bending of the stacked structure around a round bar having a diameter of 15 mm, with the transparent conductive film facing inward.

14 Claims, 1 Drawing Sheet

(51) Int. Cl.
    *G06F 3/041*    (2006.01)
    *C08J 7/04*    (2006.01)

(56) References Cited

U.S. PATENT DOCUMENTS

| | | |
|---|---|---|
| 2004/0265602 A1 | 12/2004 | Kobayashi et al. |
| 2007/0036914 A1 | 2/2007 | Tsuji et al. |
| 2007/0087134 A1* | 4/2007 | Tyan et al. ............ 428/1.3 |
| 2008/0280119 A1 | 11/2008 | Kishimoto et al. |
| 2008/0315160 A1* | 12/2008 | Fukatani et al. ............ 252/512 |
| 2009/0242887 A1* | 10/2009 | Yamamoto et al. ............ 257/59 |

FOREIGN PATENT DOCUMENTS

| | | |
|---|---|---|
| JP | 62-55127 | 3/1987 |
| JP | 11-097877 | 4/1999 |
| JP | 2003-234028 | 8/2003 |
| JP | 2004-095223 | 3/2004 |
| JP | 2007-311041 | 11/2007 |
| JP | 2008-226641 | 9/2008 |
| JP | 2008-226801 | 9/2008 |
| JP | 2009-265629 | 11/2009 |

OTHER PUBLICATIONS

Chinese Office Action dated Jun. 5, 2014 in corresponding Chinese Patent Application No. 201180023926.7.
International Search Report, PCT/JP2011/060838, Jun. 7, 2011.
Nakagawara et al., "Moisture-resistant ZnO transparent conductive films with Ga heavy doping", Applied Physics Letters 89, 091904 (2006).

\* cited by examiner

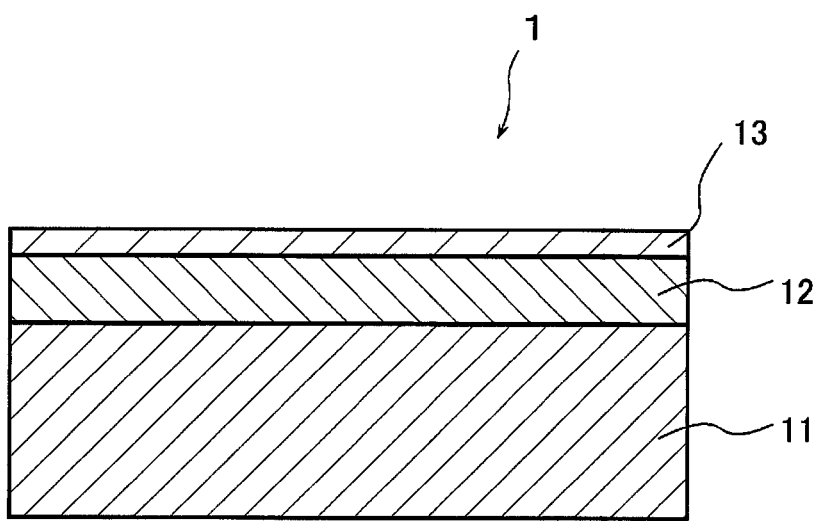

ZINC OXIDE-BASED CONDUCTIVE MULTILAYER STRUCTURE, PROCESS FOR PRODUCING THE SAME, AND ELECTRONIC DEVICE

TECHNICAL FIELD

The present invention relates to a zinc-oxide-based conductive stacked structure, to a method for producing the stacked structure, and to an electronic device.

BACKGROUND ART

Hitherto, transparent conductive film has typically been formed of ITO, which contains indium, a rare metal. Thus, there has been proposed a zinc-oxide-based conductive material, which is an alternative transparent conductive material to ITO.

In one known embodiment of zinc oxide, a conductive film containing zinc oxide is formed on a transparent substrate containing olefin resin, to thereby produce a transparent conductive film stacked structure having high optical transmittance (see, for example, Patent Document 1). The transparent conductive film stacked structure disclosed in Patent Document 1 has, in some cases, a resistivity which is not sufficiently low, and the sheet resistivity of the stacked structure deteriorates under high-moisture and high-temperature conditions, as compared with ITO.

In the case of transparent conductive film containing gallium oxide and zinc oxide, the deterioration of sheet resistivity thereof under high-moisture and high-temperature conditions is known to be suitably controlled by considerably increasing the amount of gallium oxide (dopant) and increasing the film thickness to 400 nm (see, for example, Non-Patent Document 1). When the countermeasures are employed, productivity becomes very poor due to formation of transparent conductive film having a film thickness of 400 nm, and the considerable increase in gallium oxide (dopant) amount makes the cost non-practical.

PRIOR ART DOCUMENTS

Patent Documents

Patent Document 1: Japanese Patent Application Laid-Open (kokai) No. 2008-226641

Non-Patent Documents

Non-Patent Document 1: APPLIED PHYSICS LETTERS 89, 091904 (2006)

And, there have been reported flexible devices, having a structure in which an element, which is typically a liquid crystal element or an organic electroluminescent element, is mounted on a flexible film substrate. Typically, the electrode employed in such a flexible device is made of ITO film, which is a transparent conductive film. However, since ITO is mainly formed from the aforementioned rare metal indium, demand has arisen for a material other than ITO.

Meanwhile, when a transparent conductive film is employed in such a flexible device, variation in sheet resistivity of the film before and after bending of the film is preferably small. That is, the transparent conductive film is required to have an effect of suppressing the variation in sheet resistivity that results from bending of the film (hereinafter called an "anti-bend-effect property"). However, hitherto, no transparent conductive film having sufficient anti-bend-effect property has been produced, which is a problem.

SUMMARY OF THE INVENTION

Problems to be Solved by the Invention

The present invention has been conceived in order to solve the aforementioned problems. Thus, an object of the present invention is to provide a zinc-oxide-based conductive stacked structure which includes a transparent conductive film containing zinc oxide, which has low sheet resistivity, which exhibits reduced variation in sheet resistivity even after the film has been placed under high-moisture and high-temperature conditions, and which has an excellent anti-bend-effect property. Another object is to provide a method for producing the conductive stacked structure. Still another object is to provide an electronic device including the zinc-oxide-based conductive stacked structure.

Means for Solving the Problems

In order to attain the aforementioned objects, the present inventors have conducted extensive studies, and have found that the objects can be attained by performing the step of forming a transparent conductive film on a substrate at as low a substrate temperature as possible, to thereby reduce thermal-contraction stress. The present invention has been accomplished on the basis of this finding.

Accordingly, the present invention provides the following zinc-oxide-based conductive stacked structures (1) to (3).

(1) A zinc-oxide-based conductive stacked structure comprising a substrate and, formed on at least one surface of the substrate, an undercoat layer and a transparent conductive film, characterized in that the transparent conductive film is formed of a plurality of transparent conductive layers formed from a zinc-oxide-based conductive material and has a carrier density of $2.0 \times 10^{20}$ to $9.8 \times 10^{20}$ cm$^{-3}$, and that the zinc-oxide-based conductive stacked structure exhibits a change ratio in sheet resistivity of 50 or less, after bending of the stacked structure around a round bar having a diameter of 15 mm, with the transparent conductive film facing inward.

(2) A zinc-oxide-based conductive stacked structure as described in (1) above, wherein the transparent conductive layer has a thickness of 50 to 250 nm.

(3) A zinc-oxide-based conductive stacked structure as described in (1) or (2) above, which exhibits an initial sheet resistivity R0 of 700 Ω/square or lower and which exhibits a first change ratio in sheet resistivity represented by $T1=(R1-R0)/R0$ of 1.0 or less and a second change ratio in sheet resistivity represented by $T2=(R2-R0)/R0$ of 4.0 or less, wherein R1 represents sheet resistivity after the stacked structure has been placed under 60° C. conditions for seven days, and R2 represents sheet resistivity after the stacked structure has been placed under 60° C.-90% RH conditions for seven days.

The present invention provides the following method for producing a zinc-oxide-based conductive stacked structure (4).

(4) A method for producing a zinc-oxide-based conductive stacked structure as recited in (1) above comprising a substrate and, formed on at least one surface of the substrate, an undercoat layer and a transparent conductive film, characterized in that the method comprises: an undercoat layer forming step of forming an undercoat layer on a substrate, and a transparent conductive layer forming step of forming, on the undercoat layer through ion plating, a plurality of transparent conductive layers formed from a zinc-oxide-based conductive material, to thereby form a transparent conductive film. Through ion plating of a zinc-oxide-based conductive material, a suitable transparent conductive film can be formed in a simple manner.

(5) A method for producing a zinc-oxide-based conductive stacked structure as described in (4) above, wherein, in the transparent conductive film formation step, oxygen and argon are fed to a film-formation chamber at a ratio of oxygen gas flow rate to argon gas flow rate of 1:39 to 1:1. When the rate falls within the range, the transparent conductive film has a carrier density of $2.0 \times 10^{20}$ to $9.8 \times 10^{20}$ cm$^{-3}$, which is preferred.

(6) An electronic device characterized by comprising a zinc-oxide-based conductive stacked structure as recited in any of (1) to (3) above.

Effects of the Invention

The zinc-oxide-based conductive stacked structure according to the present invention enables provision of a sheet resistivity 700 Ω/square or lower, with reduced variation in sheet resistivity even after the device has been placed under moist and hot conditions, and exhibits excellent anti-bend-effect property.

BRIEF DESCRIPTION OF THE DRAWINGS

FIG. 1 A schematic cross-sectional view of a stacked structure.

MODES FOR CARRYING OUT THE INVENTION

With reference to FIG. 1, the zinc-oxide-based conductive stacked structure of the present invention will be described. The zinc-oxide-based conductive stacked structure 1 of the present invention has a substrate 11 and, formed on at least one surface of the substrate 11, an undercoat layer 12 and a transparent conductive film 13.

The zinc-oxide-based conductive stacked structure 1 will next be described in detail.

(Substrate)

No particular limitation is imposed on the material of the substrate 11 of the zinc-oxide-based conductive stacked structure 1, so long as the objects of the invention can be attained. Examples of the material include polyimide, polyamide, polyamide-imide, polyphenylene ether, polyether ketone, polyether-ether ketone, polyolefin, polyester, polycarbonate, polysulfone, polyether sulfone, polyphenylene sulfide, polyarylate, acrylic resin, cycloolefin polymer, aromatic polymer, polyurethane, and films of a heat-curable or radiation-curable resin cured by heat or radiation. So long as transparency and conductivity are not impaired, the material may further contain various additives such as an antioxidant, a flame-retardant, and a lubricant.

Among these material, polyester, polyamide, and cycloolefin polymer are preferred from the viewpoint of high transparency and wide adaptability, with polyester or cycloolefin polymer being more preferred. Examples of the polyester include polyethylene terephthalate, polybutylene terephthalate, polyethylene naphthalate, and polyarylate. Examples of the polyamide include full-aromatic polyamide, nylon 6, nylon 66, and nylon copolymer.

Examples of the cycloolefin polymer include norbornene polymer, monocyclic olefin polymer, cyclic conjugated diene polymer, vinylic alicyclic hydrocarbon polymer, and hydrogenated products thereof. Specific examples include Apel (ethylene-cycloolefin copolymer, product of Mitsui Chemicals, Inc.), Arton (norbornene polymer, product of JSR), and Zeonor (norbornene polymer, product of Zeon Corporation).

The substrate 11 has a thickness of 10 to 500 preferably 50 to 250 μl. When the thickness conditions are met, transparency and anti-bend-effect property are excellent, and the substrate can be easily handled.

In the present invention, the substrate 11 preferably has a total light transmittance of 70% or higher and a haze of 10% or lower, as transparent indices. For attaining high transparency, a low-refractive-index material layer or a high-refractive-index material layer may be stacked on the aforementioned substrate 11.

(Undercoat Layer)

In this embodiment, the undercoat layer 12 is provided so as to prevent deterioration of the transparent conductive film 13 and to enhance stability of sheet resistivity. That is, provision of the undercoat layer 12 prevents diffusion of ingredients contained in the substrate 11 (e.g., oligomers and low-molecular weight ingredients) into the transparent conductive film 13, which causes deterioration of the transparent conductive film 13. Also, adhesion between the substrate 11 and the transparent conductive film 13 can be enhanced. Thus, when deterioration of the transparent conductive film 13 is suppressed by means of the undercoat layer 12, moisture resistance of the transparent conductive film 13 can be enhanced, whereby stability of sheet resistivity of the transparent conductive film 13 can be enhanced.

In this embodiment, stability of sheet resistivity of the transparent conductive film 13 is enhanced through provision of the undercoat layer. Specifically, the zinc-oxide-based conductive stacked structure 1 exhibits a change ratio in sheet resistivity of 50 or less, after bending of the stacked structure 1 around a round bar having a diameter of 15 mm, with the transparent conductive film 13 facing inward.

No particular limitation is imposed on the material of the undercoat layer 12, so long as the undercoat layer can prevent deterioration of the transparent conductive film 13 and stability of sheet resistivity thereof can be enhanced. Examples of the material include energy-ray-curable resins and heat-curable resins. In one preferred procedure, an undercoat layer of interest can be formed by adding thermoplastic resin or additives to an acrylate monomer serving as the energy-ray-curable resin, and employing the thus-prepared undercoat layer-forming agent. Specific examples of preferred energy-ray-curable resins include polyfunctional (meth)acrylate monomers having a molecular weight less than 1,000. As used herein, the term "(meth)acrylate" collectively refers to acrylate and methacrylate. The expression "(meth)" throughout the specification also applies the same meaning. The term "polymer" collectively refers to a homopolymer and a copolymer.

Examples of the polyfunctional (meth)acrylate monomer having a molecular weight less than 1,000 include 2-functional (meth)acrylates such as 1,4-butanediol di(meth)acrylate, 1,6-hexanediol di(meth)acrylate, neopentyl glycol di(meth)acrylate, polyethylene glycol di(meth)acrylate, neopentyl glycol adipate di(meth)acrylate, hydroxypivalic acid neopentyl glycol di(meth)acrylate, dicyclopentanyl di(meth)acrylate, caprolactone-modified dicyclopentenyl di(meth)acrylate, ethylene oxide-modified phosphoric acid di(meth)acrylate, di(acryloxyethyl) isocyanurate, allylated cyclohexyl di(meth)acrylate, dimethyloldicyclopentane di(meth)acrylate, ethylene oxide-modified hexahydrophthalic acid di(meth)acrylate, tricyclodecanedimethanol (meth)acrylate, neopentyl glycol-modified trimethylolpropane di(meth)acrylate, and adamantane di(meth)acrylate;

3-functional (meth)acrylates such as trimethylolpropane tri(meth)acrylate, dipentaerythritol tri(meth)acrylate, propionic acid-modified dipentaerythritol tri(meth)acrylate, pentaerythritol tri(meth)acrylate, propylene oxide-modified trimethylolpropane tri(meth)acrylate, and tris(acryloxyethyl) isocyanurate; 4-functional (meth)acrylates such as diglycerin tetra(meth)acrylate and pentaerythritol tetra(meth)acrylate; 5-functional (meth)acrylates such as propionic acid-modified dipentaerythritol penta(meth)acrylate; and 6-functional (meth)acrylates such as dipentaerythritol hexa(meth)acrylate and caprolactone-modified dipentaerythritol hexa(meth)acrylate.

Among them, 3-functional (meth)acrylates are preferred, with pentaerythritol tri(meth)acrylate being particularly preferred.

In the present invention, these polyfunctional (meth)acrylate monomers may be used singly or in combination of two or more species. However, these monomers preferably contain a monomer having a cyclic structure in its backbone. The cyclic structure may be a carbocyclic structure or a heterocyclic structure, or a monocyclic structure or a polycyclic structure. Examples of preferred such polyfunctional (meth)acrylate monomers include isocyanurate monomers (e.g., di(acryloxyethyl) isocyanurate and tris(acryloxyethyl) isocyanurate), dimethyloldicyclopentane di(meth)acrylate, ethylene oxide-modified hexahydrophthalic acid di(meth)acrylate, tricyclodecanedimethanol(meth)acrylate, neopentyl glycol-modified trimethylolpropane di(meth)acrylate, and adamantane di(meth)acrylate.

Alternatively, an active energy ray-curable acrylate oligomer may also be used as an energy-ray-curable resin. The acrylate oligomer preferably has a weight average molecular weight of 50,000 or less. Examples of the acrylate oligomer include polyester acrylate oligomers, epoxy acrylate oligomers, urethane acrylate oligomers, polyether acrylate oligomers, polybutadiene acrylate oligomers, and silicone acrylate oligomers.

The polyester acrylate oligomers may be produced through condensation between a polyvalent carboxylic acid and a polyhydric alcohol, to thereby form a polyester oligomer having a hydroxyl group at each end, and esterification of the hydroxyl group of the polyester oligomer with (meth)acrylic acid. Alternatively, the polyester acrylate oligomers may be produced through addition of an alkylene oxide to a polyvalent carboxylic acid, to thereby form an oligomer having a hydroxyl group at each end, and esterification of the hydroxyl group of the oligomer with (meth)acrylic acid. The epoxy acrylate oligomers may be produced through esterification of oxirane rings of a bisphenol-type epoxy resin or a novolak epoxy resin having relatively low molecular weight with (meth)acrylic acid. The epoxy acrylate oligomers may be partially modified with a dibasic carboxylic anhydride, to thereby form carboxyl-modified epoxy acrylate oligomers, and the modified oligomers may also be used. The urethane acrylate oligomers may be produced through reaction between a polyether-polyol or a polyester-polyol and a polyisocyanate, to thereby form a polyurethane oligomer, and esterification of the polyurethane oligomer with (meth)acrylic acid. The polyol acrylate oligomers may be produced through esterification of hydroxyl groups of a polyether-polyol with (meth)acrylic acid.

The weight average molecular weight of the acrylate oligomer, as determined through gel permeation chromatography (GPC) and reduced to polystyrene standard, is preferably 50,000 or less, more preferably 500 to 50,000, still more preferably 3,000 to 40,000.

These acrylate oligomers may be used singly or in combination of two or more species. Among them, a urethane acrylate oligomer is preferred.

As the energy-ray-curable resin, an adduct acrylate polymer having side chains to which a group having (meth)acryloyl group containing group has been introduced may be used. Such an adduct acrylate polymer may be produced, in a known (meth)acrylate ester copolymer, from a (meth)acrylic acid ester and a monomer having a cross-linkable functional group in the molecule thereof. In a specific procedure, a part of the cross-linkable functional groups of the copolymer are reacted with a compound having a functional group reacting with the (meth)acryloyl groups and with the cross-linkable functional groups. The weight average molecular weight of the adduct acrylate polymer, as determined through GPC and reduced to polystyrene standard, is generally 500,000 to 2,000,000. The aforementioned polyfunctional acrylate monomers, acrylate oligomers, and adduct acrylate polymers may be appropriately used singly or in combination of two or more members.

The undercoat layer 12 may further contain a thermoplastic resin so as to enhance adhesion between the substrate 11 and the undercoat layer 12. No particular limitation is imposed on the thermoplastic resin, and a variety of thermoplastic resins may be used. Examples of preferred thermoplastic resins include polyester resin, polyester-urethane resin, and acrylic resin. These thermoplastic resins may be used singly or in combination of two or more species.

Examples of the polyester resin include polymers produced through polycondensation of at least one alcohol and at least one carboxylic acid, the alcohol selected from among ethylene glycol, propylene glycol, 1,3-butanediol, 1,4-butanediol, diethylene glycol, triethylene glycol, 1,5-pentanediol, 1,6-hexanediol, neopentyl glycol, cyclohexane-1,4-dimethanol, hydrogenated bisphenol A, and bisphenol A ethylene oxide or propylene oxide adducts, and the carboxylic acid selected from terephthalic acid, isophthalic acid, naphthalenedicarboxylic acid, cyclohexane-1,4-dicarboxylic acid, adipic acid, azelaic acid, maleic acid, fumaric acid, itaconic acid, and anhydrides thereof.

Examples of the polyester-urethane resin include polymers produced through polycondensation of any of the alcohols and carboxylic acids exemplified in relation to the aforementioned polyester resin and reacting the thus-formed hydroxyl-end-capped polyester-polyol with any of a variety of polyisocyanate compounds.

Examples of the acrylic resin include a polymer formed from at least one monomer selected from alkyl(meth)acrylates including alkyl groups having 1 to 20 carbon atoms and a copolymer formed from the monomer selected from the alkyl(meth)acrylates and another polymerizable monomer.

Among them, polyester resin and/or polyester-urethane resin are/is particularly preferred, since the moisture resistance of the transparent conductive film 13 can be enhanced, and stability of sheet resistivity of the transparent conductive film 13 can be enhanced.

If needed, the coating agent for forming the undercoat layer may further contain a photopolymerization initiator. The photopolymerization initiator is appropriately chosen in consideration of the polymerization mechanism of the energy-ray-curable resin. Examples of the photopolymerization initiator with respect to monomers and oligomers of a radical polymerization type include benzoin, benzoin methyl ether, benzoin ethyl ether, benzoin isopropyl ether, benzoin n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl- 1-phenylpropan-1-one, 1-hydroxycyclohexyl phenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-ethylanthraquinone, 2-tert-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethyl ketal, acetophenone dimethyl ketal, p-dimethylaminobenzoic acid ester, oligo[2-hydroxy-2-methyl-1[4-(1-methylvinyl)phenyl]propanone], and 2,4,6-trimethylbenzoyl diphenylphosphine oxide. These photopolymerization initiators may be used singly or in combination of two or more species. The amount of photopolymerization initiator(s) is generally 0.01 to 20 parts by mass with respect to 100 parts by mass of energy-ray-curable resin. Examples of the photopolymerization initiator with respect to photopolymerizable monomers and oligomers of a cationic polymerization type include compounds formed of an onium and an anion, the onium being an aromatic sulfonium ion, an aromatic oxosulfonium ion, an aromatic iodonium ion, etc., and the anion being tetrafluoroborate, hexafluorophsphate, hexafluoroantimonate, hexafluoroarsenate, etc.

In a preferred embodiment of the preparation of the undercoat layer 12 of the present invention, a coating agent for forming an undercoat layer containing an energy-ray-curable resin, a thermoplastic resin, and a solvent is applied onto a substrate, and the solvent is removed by heating, followed by irradiating the coating agent with an energy ray for curing.

The coating agent for forming the undercoat layer preferably contains the energy-ray-curable resin and the thermoplastic resin at a ratio by mass of 100:0.1 to 100:20. When the thermoplastic resin content is 0.1 to 20 parts by mass with respect to 100 parts by mass of energy-ray-curable resin, interlaminar adhesion and moisture/heat resistance of the conductive layer are enhanced. In contrast, when the thermoplastic resin content falls outside the range, no remarkable effect is prone to be attained.

The coating agent for forming the undercoat layer may further contain additives. Examples of such additives include an antistatic agent, an antioxidant, a UV-absorbing agent, a photo-stabilizer, a defoaming agent, and a leveling agent. These additives are added to the coating agent in appropriate amounts and dissolved or dispersed therein.

In this embodiment, the coating agent for forming the undercoat layer is applied onto the substrate 11. When the coating agent contains a diluent, the applied coating agent is dried. Then, the coating agent is irradiated with an energy ray for curing, whereby the undercoat layer 12 is formed.

Examples of the method for applying the coating agent for forming the undercoat layer onto the substrate 11 include bar coating, knife coating, roller coating, blade coating, die coating, gravure coating, and curtain coating, which are known in the art.

The energy ray employed in the invention is generated by means of a variety of energy-ray-generators. For example, UV-rays employed in the invention are generally radiated by a UV lamp. The UV lamp generally emits UV rays having a spectral peak in wavelength of 300 to 400 nm, and examples of the UV lamp include a high-pressure mercury lamp, a Fusion H lamp, and a xenon lamp. Generally, the dose is preferably 50 to 3000 mJ/cm$^2$.

The thus-formed undercoat layer 12 preferably has a thickness of 0.01 to 20 μm, particularly preferably 0.05 to most preferably 0.1 to 10 μm.

(Transparent Conductive Film)

In this embodiment, the transparent conductive film 13 is formed of a plurality of transparent conductive layers formed from a zinc-oxide-based conductive material and stacked. The reason for employing the stacked structure of the transparent conductive film 13 is as follows. The transparent conductive film 13 preferably has a larger thickness in order to attain low resistivity. However, as described hereinbelow, in the case where the transparent conductive film 13 is formed by means of an ion-plating apparatus, a thermal load applied to the substrate 11 increases as the time of plasma treatment in the chamber increases. Thus, the thickness of the film formed by one ion plating operation is reduced so as to shorten the plasma treatment time of the substrate 11, to thereby prevent deformation of the substrate 11 due to a thermal load. That is, the temperature applied to the substrate 11 is reduced to a maximum extent so as to reduce thermal-contraction stress in the substrate 11, to thereby prevent deformation of the substrate 11.

In one case, the thickness of the transparent conductive film 13 is adjusted to 150 nm so as to attain a sheet resistivity of interest. When a transparent conductive film 13 having a thickness of 150 nm is formed through one film formation operation, the substrate 11 unavoidably receives a large thermal load, resulting in deformation of the substrate 11. In contrast, when a transparent conductive layer having a thickness of 30 nm is repeatedly formed five times, to thereby form a transparent conductive film 13 having a total thickness of 150 nm, the substrate 11 receives only a small thermal load, whereby deformation of the substrate 11 can be prevented.

Thus, in this embodiment, a plurality of transparent conductive layers are stacked to form the transparent conductive film 13 so as to reduce a thermal load to the substrate 11.

The transparent conductive film 13 has a thickness of 50 to 250 nm, preferably 70 to 200 nm, more preferably 100 to 150 nm. When the thickness of the transparent conductive film 13 is larger than 250 nm, the thermal-contraction stress in the transparent conductive film 13 increases, resulting in cracking of the transparent conductive film 13, whereas when the thickness of the transparent conductive film 13 is less than 50 nm, specific resistivity increases, and a sheet resistivity of interest may fail to be attained. Notably, the thickness of the transparent conductive film 13 may be appropriately adjusted in response to the target sheet resistivity.

In a preferred mode, the transparent conductive film 13 is formed of a plurality of transparent conductive layers stacked each preferably having a thickness of 50 nm or less, more preferably 30 nm or less. When the transparent conductive layer has a thickness of 50 nm or less, the substrate 11 receives substantially no thermal load, and the transparent conductive film 13 can be formed with high film quality.

In addition, through forming the transparent conductive film 13 from a plurality of stacked transparent conductive layers, conditions under which the transparent conductive film 13 is formed through ion plating (mentioned hereinbelow) may be readily tuned layer by layer. Specifically, the flow rates of argon and oxygen fed into the chamber are regulated, to thereby modify the crystallinity, carrier density, and mobility of the transparent conductive film 13. As a result, a sheet resistivity of interest can be attained.

In this embodiment, the transparent conductive film 13 has a carrier density of $2.0 \times 10^{20}$ to $9.8 \times 10^{20}$ cm$^{-3}$. When the carrier density of the transparent conductive film 13 falls within the range, the sheet resistivity of the transparent conductive film 13 can be reduced, and variation in sheet resistivity can be stabilized for a long period of time, even under high-moisture and high temperature conditions. When the carrier density falls within the range, optical characteristics (specifically, total light transmittance) of the transparent conductive film 13 are enhanced.

The carrier density of the transparent conductive film 13 may be determined through a known method. Although the method will be described in detail in the Examples, the carrier density may be determined through measurement of Hall effect based on the Van der Pauw's method.

The zinc-oxide-based conductive material which forms the transparent conductive film 13 contains zinc oxide as a predominant component and preferably has a zinc oxide content of 85 mass % or higher, more preferably 90 mass % or higher, particularly preferably 95 mass % or higher. No particular limitation is imposed on the composition (excluding zinc oxide) of the zinc-oxide-based conductive material, and a variety of additional elements and additives may be added to the conductive material. Examples of such additives include aluminum, gallium, boron, silicon, tin, indium, germanium, antimony, iridium, rhenium, cerium, zirconium, scandium, and yttrium. These additional elements and additives may be contained at least one member or more. The amount of additive is preferably 0.05 to 15 mass %, more preferably 0.5 to 10 mass %. When two or more additional elements and additives are added, the total amount thereof is preferably adjusted to 15 mass % or less, more preferably 10 mass % or less. Among these additional elements and additives, digallium trioxide is preferred. Specifically, a zinc oxide-based material containing digallium trioxide in an amount of 1 to 10 mass % provides the transparent conductive film 13 with excellent conductivity.

The crystal structure of the transparent conductive film 13 according to this embodiment may be determined through X-ray diffractometry from a half width and lattice constants (e.g., c-axis and a-axis). The measurement may be performed though a known method, which is described in the Examples. The thermal stress and contraction stress in the transparent conductive film 13 may be estimated through, for example, based on the results of X-ray diffractometry by method disclosed in documents (Journal Of Physics, Condensed Matter, Volume 7, Number 48, pp. 9147, 1995; Chemical Materials, vol. 8, pp. 433, 1996). For example, the transparent conductive film 13 of this example exhibits a diffraction peak attributed to (002) plane at a $2\theta$ of about 34.420° (by out-of-plane), but no diffraction peak attributed to (004) plane at a $2\theta$ of about 72.563°. Also, the transparent conductive film 13 exhibits a diffraction peak attributed to (100) plane at a $2\theta_\chi$ of about 31.772°, that attributed to (200) plane at a $2\theta_\chi$ of about 66.384°, and that attributed to (300) plane at a $2\theta_\chi$ of about 110.404° (by in-plane).

In other words, the transparent conductive film 13 according to this embodiment has a crystal structure in which transparent conductive layers formed of zinc-oxide-based transparent conductive material are c-axis-oriented on the substrate 11. In this case, the lattice constant of the c axis is, for example, 5.23 to 5.25 Å. Although unequivocal correlation between the anti-bend-effect property and the structure of the transparent conductive film 13 is difficult to obtain, the c-axis lattice constant is likely to increase when a multilayer structure is employed, concomitant with enhancement in anti-bend-effect property.

Next, the method for forming the transparent conductive film 13 according to the present invention will be described. The transparent conductive film 13 may be formed by stacking transparent conductive layers formed of a zinc-oxide-based conductive material on the aforementioned undercoat layer 12 through a known method such as sputtering, ion plating, vacuum vapor deposition, or chemical vapor deposition. Among them, the film is preferably formed through ion plating. As compared with sputtering (for example), flying particles have small kinetic energy in ion plating. Therefore, the undercoat layer 12 and the formed transparent conductive layers receive less damage collision with particles, and the transparent conductive film 13 having high orientation degree along the thickness direction and suitable crystallinity is formed.

Before formation of the transparent conductive film 13 on the undercoat layer 12, the undercoat layer 12 and the substrate 11 may be subjected preliminary treatment; i.e., heat treatment in vacuum or atmosphere at a temperature not higher than the melting point of the substrate 11, plasma treatment, or irradiation with UV rays.

In an ion plating apparatus for conducting ion plating, a zinc-oxide-based conductive material column or rod is directly exposed to plasma beam emitted by a pressure-gradient plasma gun installed in a chamber of the apparatus. The zinc-oxide-based conductive material which has been exposed to the plasma beam is gradually heated, whereby the zinc-oxide-based conductive material sublimates. The sublimated material is ionized by the plasma beam, and the generated ions deposit on the undercoat layer 12, to thereby form a transparent conductive layer. In the film formation step, argon and oxygen are fed into the chamber at a back pressure adjusted to $1.0 \times 10^{-3}$ Pa or lower, preferably $5.0 \times 10^{-5}$ Pa or lower, to thereby regulate the chamber pressure to about 0.01 to about 5 Pa. In the ion plating apparatus, the ratio of argon flow rate to oxygen flow rate may be controlled. When the ratio of argon flow rate to oxygen flow rate on the undercoat layer 12 is adjusted to 1:40 to 1:1, a plurality of transparent conductive layers formed of a zinc-oxide-based conductive material is formed. The oxygen partial pressure is about $1.0 \times 10^{-1}$ Pa to about $1.0 \times 10^{-3}$ Pa.

The argon flow rate is preferably 5 to 1,000 sccm, more preferably 50 to 300 sccm. The oxygen flow rate is more than 5 sccm and less than 100 sccm, preferably 10 to 50 sccm, more preferably 15 to 25 sccm. When a plurality of transparent conductive layers are formed under the gas flow rate conditions, the transparent conductive film 13 having a carrier density of interest can be produced. When the oxygen flow rate is 5 sccm or less, the transparent conductive film 13 having a carrier density of interest cannot be produced, and the transparency of the film is poor (i.e., low transmittance in a visible light region). When the oxygen flow rate 100 sccm or more, the transparent conductive film 13 having a carrier density of interest cannot be produced, and the transparent conductive film 13 has high sheet resistivity. In this case, a target sheet resistivity is difficult to attain.

The transparent conductive layer serving as the outermost layer of the transparent conductive film 13 is formed at a ratio of flow rates of oxygen and argon fed into the chamber of 1:39 to 1:1. Under the flow rate conditions, the carrier density of the transparent conductive film 13 can be adjusted to fall within a desired range. Preferably, the ratio of flow rates of oxygen and argon fed into the chamber of 1:20 to 1:8. Under the preferred flow rate conditions, the sheet resistivity can be more effectively regulated under high-moisture and high-temperature conditions.

The rise in chamber temperature during film formation can be prevented by causing water cooled to 5 to 30° C. to flow through the inside of the chamber. The film formation temperature in the vicinity of the substrate 11 is preferably 10 to 50° C. Formation of the transparent conductive film 13 may be carried out, while the substrate 11 is conveyed. No particular limitation is imposed on the convey speed of the substrate 11 during film formation, so long as the temperature in the vicinity of the substrate falls within the aforementioned range. For example, in examples, the substrate 11 can be conveyed at a high convey speed of 1.0 m/min or more, whereby the temperature in the vicinity of the substrate 11 can be cooled to a low temperature of 10 to 50° C. Through such high-speed conveyance, the undercoat layer 12 receives less damage. In the case where a plurality of transparent conductive layers forming the transparent conductive film 13 are formed, an ion plating apparatus having a plurality of juxtaposing film-formation chambers may be used. In operation, the substrate is moved through the juxtaposing chambers, to thereby form a plurality of transparent conductive layers.

(Zinc-Oxide-Based Conductive Stacked Structure)

The thus-formed zinc-oxide-based conductive stacked structure 1 of this embodiment includes the substrate 11 and, formed on at least one surface of the substrate, the undercoat layer 12 and the transparent conductive film 13, wherein the transparent conductive film 13 is formed of a plurality of transparent conductive layers formed from a zinc-oxide-based conductive material and has a carrier density falling within a specific range.

The zinc-oxide-based conductive stacked structure 1 of the embodiment also has low sheet resistivity, excellent moisture resistance, and excellent anti-bend-effect property. Specifically, regarding sheet resistivity and moisture resistance, the zinc-oxide-based conductive stacked structure 1 of the embodiment preferably exhibits an initial sheet resistivity R0 of 700 Ω/square or lower and exhibits a first change ratio T1 in sheet resistivity represented by the following equation (1) of 1.0 or less and a second change ratio T2 in sheet resistivity represented by the following equation (2) of 4.0 or less, $$T1=(R1-R0)/R0 \quad (1)$$

$$T2=(R2-R0)/R0 \quad (2)$$

wherein R1 represents sheet resistivity after the stacked structure has been placed under 60° C. conditions for seven days, and R2 represents sheet resistivity after the stacked structure has been placed under 60° C.-90% RH conditions for seven days. The transparent conductive film 13 preferably has a thickness of 100 nm to 250 nm. In the present invention, the term "initial sheet resistivity R0" refers to a resistivity measured before subjecting to a moisture and heat resistance test, and the term "60° C. conditions" refers to conditions of 60° C. and a relative humidity of 10% or lower. Notably, the sheet resistivity of the zinc-oxide-based conductive stacked structure 1 may be determined through a known method (e.g., four probe method at constant current).

Specifically, regarding anti-bend-effect property, the zinc-oxide-based conductive stacked structure 1 of the present invention exhibits a change ratio in sheet resistivity T3 of 50 or less, after bending of the stacked structure around a round bar made of acrylic resin and having a diameter of 15 mm, with the transparent conductive film 13 facing inward. The change ratio in sheet resistivity T3 is calculated by the following equation (3):

$$T3=R3/R0 \quad (3)$$

wherein R0 represents sheet resistivity before bending, and R3 represents sheet resistivity after bending. When the produced zinc-oxide-based conductive stacked structure 1 exhibits a change ratio in sheet resistivity T3 of 50 or less, this indicates that rise in sheet resistivity after bending can be suppressed, causing no problem in practical use.

As used herein, the term "anti-bend-effect property" refers to a property of a conductive film which exhibits a small change ratio in sheet resistivity when the stacked structure is bent around the aforementioned round bar. The smaller the change ratio in sheet resistivity, the more excellent the anti-bend-effect property. The anti-bend-effect property is an important property required in the case where the transparent conductive film formed on the substrate is wound up roll-to-roll. When the zinc-oxide-based conductive stacked structure 1 has excellent anti-bend-effect property; i.e., a change ratio in sheet resistivity T3 of 50 or less, such a stacked structure can be effectively produced by the roll-to-roll technique. The zinc-oxide-based conductive stacked structure 1 is suitably employed in electronic devices requiring anti-bend-effect property. Such electronic devices include display surfaces of flexible electronic paper displays and touch-panels, and electrodes of semiconductor devices such as photoelectric conversion devices (e.g., electroluminescence devices and organic thin-film solar cell devices) and thermoelectric conversion devices.

The zinc-oxide-based conductive stacked structure 1 of the present invention also has excellent transparency. Such high transparency of the zinc-oxide-based conductive stacked structure 1 of the present invention may be confirmed by a total light transmittance as high as 70% or higher. The haze of the stacked structure of the present invention is preferably 10% or less. Total light transmittance and haze may be determined by means of a known visible light transmittance meter.

For attaining the aforementioned transparency, the zinc-oxide-based conductive stacked structure 1 may further include a low-refractive-index layer or a high-refractive-index layer.

(Electronic Device)

The zinc-oxide-based conductive stacked structure 1 of the present invention exhibits a sheet resistivity of 700 Ω/square or lower, reduced variation in sheet resistivity even after placement under high-moisture and high-temperature conditions, and excellent anti-bend-effect property. Thus, the stacked structure of the present invention suitably serves as parts of electronic devices.

The electronic device of the present invention has the zinc-oxide-based conductive stacked structure 1 of the present invention. Examples of the electronic device which employs the stacked structure of the present invention include display surfaces of electronic paper displays, touch-panels, liquid crystal displays, organic EL displays, and inorganic EL display, and electrodes of semiconductor devices such as solar cells, organic transistors, and thermoelectric conversion devices. Since the electronic device of the present invention includes the zinc-oxide-based conductive stacked structure 1 of the present invention, the device exhibits low sheet resistivity, reduced variation in sheet resistivity even after placement under high-moisture and high-temperature conditions, and excellent anti-bend-effect property.

EXAMPLES

The present invention will next be described in more detail by way of examples, which should not be construed as limiting the invention thereto.

(1) Total Light Transmittance

According to JIS K 7361-1, the total light transmittance of the substrate 11 and that of the zinc-oxide-based conductive stacked structure 1 were measured by means of a transmittance meter "NDH2000" (product of Nippon Denshoku Industries Co., Ltd.).

(2) Haze

According to JIS K 7136, the haze of the substrate 11 and that of the zinc-oxide-based conductive stacked structure 1 were measured by means of a transmittance meter "NDH2000" (product of Nippon Denshoku Industries Co., Ltd.).

(3) Sheet Resistivity

The sheet resistivity of the zinc-oxide-based conductive stacked structure 1 was measured by means of an apparatus "LORESTA-GP MCP-T600" (product of Mitsubishi Chemical Corporation). The probe set employed in the measurement was "PROBE TYPE LSP" (product of Mitsubishi Chemical Analytech Co., Ltd.). The measurement was carried out at 23° C. and 50% RH.

(4) Mobility and Carrier Density

The zinc-oxide-based conductive stacked structure 1 was subjected to a Hall effect measurement according to the Van Der Pauw's method by means of an HL5500 PC Hall effect analyzer (product of Toho Technology) with a probe (diameter of tip: 250 μm).

(5) Moisture and Heat Test

The zinc-oxide-based conductive stacked structure 1 was placed under 60° C. (RH ≤10%) conditions or 60° C. (RH: 90%) conditions for 7 days. After removal, the stacked structure was conditioned under 23° C.-50% RH conditions for one day, and the sheet resistivity was measured. From the sheet resistivity measured before placement (R0), the sheet resistivity measured after placement 60° C. conditions for 7 days (R1), and the sheet resistivity measured after placement 60° C.-90RH conditions for 7 days (R2), the first change ratio in sheet resistivity (T1) and the second change ratio in sheet resistivity (T2) were determined by the following equations:

$$T1=(R1-R0)/R0$$

$$T2=(R2-R0)/R0.$$

(6) Anti-Bend-Effect Property Test

The zinc-oxide-based conductive stacked structure 1 was bend around a round bar made of acrylic resin and having a diameter of 15 mm, with the transparent conductive film 13 facing inward. The bending state was maintained for 30 seconds. The change ratio in sheet resistivity T3 after bending was calculated by the following equation: T3=R3/R0, wherein R0 represents sheet resistivity before bending, and R3 represents sheet resistivity after bending.

(7) X-Ray Diffraction

An X-ray diffractometer (Rigaku Co., Ltd.) was employed. Each sample holder was fixed by means of Porous Table (product of Rigaku Co., Ltd.). The measurement was performed under the following conditions, and half width values were calculated by analysis software (ATX Data Processing Software (32 bit version) (product of Rigaku Co., Ltd.). Each peak was fitted through the psedo-Voigt method. The c-axis lattice constant was calculated by the following equations.

<Out-of-Plane Measurement>
X-ray source: Cu-Kα1, wavelength: 1.540 Å
Optical system: Parallel beam optical system
Slit conditions:
  S1: width of 10 mm, height of 1 mm
  S2: width of 10 mm, height of 0.5 mm
  RS: width of 10 mm, height of 1 mm
  GS: none
Scanning speed: 2°/min
Measurement angle: 20° to 90°
<In-Plane Measurement>
X-ray source: Cu-Kα1, wavelength: 1.540 Å
Optical system: Parallel beam optical system
Slit conditions:
  S1: width of 10 mm, height of 0.2 mm
  Solar slit: 0.48°
  S2: width of 10 mm, height of 0.1 mm
  RS: none
  GS: none
Scanning speed: 1°/min
Measurement angle: 20° to 120°

<Calculation of c-Axis Lattice Constant>

The lattice spacing d was obtained from the (002) peak value through the Bragg's equation (4). The lattice constant was obtained from the equation (5) between the hexagonal (hkl)-plane lattice constants (a and c) and the lattice spacing d. The lattice constant was calculated with a 1/20 of half width value as an error.

The lattice spacing d of (hkl)-plane and lattice constants a and c, have the following relationships:

$$2d \sin \theta = n\lambda \quad (4)$$

$$d = \frac{a}{\sqrt{\frac{4}{3}(h^2 + hk + k^2) + \frac{a^2(l^2)}{c^2}}} \quad (5)$$

By inputting (002) plane into the equation (5), c is 2d. The lattice constant c was obtained by the lattice spacing d.

(8) Evaluation of Zinc-Oxide-Based Conductive Stacked Structure (8)-1 Appearance The transparent conductive film 13 side of the zinc-oxide-based conductive stacked structure 1 was observed. When no deformation, no warpage, or no cracking was observed, the structure was evaluated with a rating "○," whereas when deformation, warpage, or cracking was observed, the structure was evaluated with a rating "X."

(8)-2 Optical Characteristics

When the total light transmittance was 70% or higher and the haze was 10% or less, the structure was evaluated with a rating of "○." The other cases were evaluated with a rating of "X."

Example 1

A polyethylene terephthalate (PET) film having one easy-adhesion surface (Cosmoshine A4300, product of Toyobo, thickness 188 μm) was used as the substrate 11. Separately, a coating agent for forming the undercoat layer was prepared from the following materials. The coating agent was applied to the easy-adhesion surface of the PET film serving as the substrate 11, by means of a bar coater #12 to a film thickness (dry) of 5 μm and dried at 80° C. for one minute. The dried coating was irradiated with UV light (conditions: high-pressure mercury lamp, illuminance: 310 mW/cm$^2$, luminous energy: 300 mJ/cm$^2$), to thereby form the undercoat layer 12.

(Coating Agent for Forming Undercoat Layer)

A-TMM-3 (pentaerythritol triacrylate, product of Shin-Nakamura Chemical Co., Ltd.), 100 parts by mass U-4HA (urethane acrylate, product of Shin-Nakamura Chemical Co., Ltd.), 20 parts by mass Sanprene IB422 (acryl-modified polyester yellowing-free polyurethane resin, product of Sanyokasei Co., Ltd.), 2 parts by mass IRGACURE 184 (photopolymerization initiator, product of Ciba Japan), 4 parts by mass SH-28PA (leveling agent, product of Dow Corning Toray), 0.03 parts by mass Toluene, 100 parts by mass Ethyl cellosolve, 140 parts by mass Subsequently, the substrate 11 (sample size: 150 mm×150 mm) on which the undercoat layer 12 had been formed was dried by means of a vacuum drier at 90° C. for one hour, to thereby remove microamounts of impurities including water and low-molecular weight ingredients. Then, the transparent conductive film 13 was formed through ion plating under the following conditions, to thereby complete the zinc-oxide-based conductive stacked structure 1.
(Film Formation Conditions)
Zinc-oxide-based conductive material: sintered zinc oxide containing 4 mass digallium trioxide
Discharge voltage: 68 V
Discharge current: 143 Å
Ratio of oxygen flow rate:argon flow rate (to film formation chamber)=1:20 (fed oxygen flow rate: 10 sccm)
Film formation operation: 4 times
Total thickness of zinc-oxide-based transparent conductive film 13: 130 nm Example 2

The procedure of Example 1 was repeated, except that the ratio of oxygen flow rate to argon flow rate (to the film formation chamber) was changed to 1:13 (fed oxygen flow rate: 15 sccm), to thereby produce the zinc-oxide-based conductive stacked structure 1.

Example 3

The procedure of Example 1 was repeated, except that the ratio of oxygen flow rate to argon flow rate (to the film formation chamber) was changed to 1:10 (fed oxygen flow rate: 20 sccm), to thereby produce the zinc-oxide-based conductive stacked structure 1.

Example 4

The procedure of Example 1 was repeated, except that the ratio of oxygen flow rate to argon flow rate (to the film formation chamber) was changed to 1:8 (fed oxygen flow rate: 25 sccm), to thereby produce the zinc-oxide-based conductive stacked structure 1.

Example 5

The procedure of Example 1 was repeated, except that the ratio of oxygen flow rate to argon flow rate (to the film formation chamber) was changed to 1:4 (fed oxygen flow rate: 50 sccm), to thereby produce the zinc-oxide-based conductive stacked structure 1.

Example 6

A polyethylene naphthalate (PEN) film having one easy-adhesion surface (Teonex Q65FA, product of Teijin DuPont Films, thickness 200 μm) was used as the substrate 11. Subsequently, the same coating agent as employed in Example 1 was applied to the easy-adhesion surface, and the undercoat layer 12 was formed in a manner similar to that of Example 1. Then, the transparent conductive film 13 was formed in a manner similar to that of Example 3, to thereby complete the zinc-oxide-based conductive stacked structure 1.

Example 7

A polyethylene naphthalate (PEN) film having one easy-adhesion surface (Teonex Q65FA, product of Teijin DuPont Films, thickness 200 μm) was used as the substrate 11. Subsequently, the same coating agent as employed in Example 1 was applied to the easy-adhesion surface, and the undercoat layer 12 was formed in a manner similar to that of Example 1. Then, while the flow rate of oxygen fed to the film formation chamber was maintained as that employed in Example 1, film formation was carried out once at the ratio of oxygen flow rate to argon flow rate of 1:10. On the thus-formed layer, film formation was carried out twice at the ratio of oxygen flow rate to argon flow rate (to the film formation chamber) of 1:13. On the thus-formed layer, film formation was further carried out once at the ratio of oxygen flow rate to argon flow rate (to the film formation chamber) of 1:10. Thus, film formation operation was carried out four times, to thereby form the transparent conductive film 13, whereby the zinc-oxide-based conductive stacked structure 1 was produced.

Example 8

A polyethylene naphthalate (PEN) film having one easy-adhesion surface (Teonex Q65FA, product of Teijin DuPont Films, thickness 200 μm) was used as the substrate 11. Subsequently, the same coating agent as employed in Example 1 was applied to the easy-adhesion surface, and the undercoat layer 12 was formed in a manner similar to that of Example 1. Then, the film formation conditions as employed in Example 3 were employed, except that the film formation was carried out twice, to thereby form the transparent conductive film 13, whereby the zinc-oxide-based conductive stacked structure 1 was produced.

Comparative Example 1

The procedure of Example 6 was repeated, except that the transparent conductive film 13 having a thickness of 130 nm was formed through one film formation operation, to thereby produce the zinc-oxide-based conductive stacked structure 1.

Comparative Example 2

The procedure of Example 1 was repeated, except that the ratio of oxygen flow rate to argon flow rate (to the film formation chamber) was changed to 1:40 (fed oxygen flow rate: 5 sccm), to thereby produce the zinc-oxide-based conductive stacked structure 1.

Comparative Example 3

The procedure of Example 1 was repeated, except that the ratio of oxygen flow rate to argon flow rate (to the film formation chamber) was changed to 1:1 (fed oxygen flow rate: 100 sccm), to thereby produce the transparent conductive stacked structure 1.

Comparative Example 4

The procedure of Example 1 was repeated, except that no undercoat layer 12 was formed on the substrate 11, to thereby produce the zinc-oxide-based conductive stacked structure 1.

Tables 1 and 2 show the results of the Examples and Comparative Examples.

TABLE 1

|  | Ex. 1 | Ex. 2 | Ex. 3 | Ex. 4 | Ex. 5 | Ex. 6 |
|---|---|---|---|---|---|---|
| Transparent flexible substrate | PET | PET | PET | PET | PET | PEN |
| Total light transmittance (%) | 92 | 92 | 92 | 92 | 92 | 85 |
| Haze (%) | 0.9 | 0.9 | 0.9 | 0.9 | 0.9 | 0.8 |
| Undercoat | yes | yes | yes | yes | yes | yes |
| ZnO conductive film stacked structure |  |  |  |  |  |  |
| ZnO conductive film formation | 4 | 4 | 4 | 4 | 4 | 4 |
| Flow rate ratio at film formation Oxygen/argon | 1/20 | 1/13 | 1/10 | 1/8 | 1/4 | 1/10 |
| Appearance deform/warp | ○ | ○ | ○ | ○ | ○ | ○ |
| ZnO conductive film thickness (nm) | 130 | 130 | 130 | 130 | 130 | 130 |
| Total light transmittance (%) | 81 | 89 | 88 | 83 | 80 | 82 |
| Haze (%) | 1.3 | 1.2 | 1.2 | 1.1 | 4.3 | 5.1 |
| Optical characteristics | ○ | ○ | ○ | ○ | ○ | ○ |
| Sheet resistivity (Ω/square) | 70 | 38 | 45 | 120 | 650 | 35 |
| Mobility (cm$^2$/Vs) | 9.2 | 13.5 | 16.5 | 14.6 | 4 | 16 |
| Carrier density (cm$^{-3}$) | $9.23 \times 10^{20}$ | $8.10 \times 10^{20}$ | $6.50 \times 10^{20}$ | $4.22 \times 10^{20}$ | $2.10 \times 10^{20}$ | $6.40 \times 10^{20}$ |
| X-ray diffraction (002) half width | 0.4291 | 0.4288 | 0.4280 | 0.4190 | 0.4288 | 0.4284 |
| X-ray diffraction (100) half width | 0.8779 | 0.8756 | 0.8736 | 0.8723 | 0.8735 | 0.8735 |
| c-Axis lattice const. | 5.2488 | 5.2466 | 5.2430 | 5.2420 | 5.2520 | 5.2422 |

|  | Ex. 7 | Ex. 8 | Comp. Ex. 1 | Comp. Ex. 2 | Comp. Ex. 3 | Comp. Ex. 4 |
|---|---|---|---|---|---|---|
| Transparent flexible substrate | PEN | PEN | PEN | PET | PET | PET |
| Total light transmittance (%) | 85 | 85 | 85 | 92 | 92 | 92 |
| Haze (%) | 0.8 | 0.8 | 0.8 | 0.9 | 0.9 | 0.9 |
| Undercoat | yes | yes | yes | yes | yes | no |
| ZnO conductive film stacked structure |  |  |  |  |  |  |
| ZnO conductive film formation | 4 | 2 | 1 | 4 | 4 | 4 |
| Flow rate ratio at film formation Oxygen/argon | 1st 1/10<br>2nd 1/13<br>3rd 1/13<br>4th 1/10 | 1/10 | 1/10 | 1/40 | 1/1 | 1/20 |
| Appearance deform/warp | ○ | ○ | X: deform | ○ | ○ | ○ |
| ZnO conductive film thickness (nm) | 130 | 130 | 130 | 130 | 130 | 130 |
| Total light transmittance (%) | 81 | 81 | 79 | 55 | 70 | 89 |
| Haze (%) | 5.1 | 5.2 | 4.1 | 3.8 | 5.8 | 1.2 |
| Optical characteristics | ○ | ○ | ○ | X | ○ | ○ |
| Sheet resistivity (Ω/square) | 35 | 38 | 60 | 600 | 2300 | 68 |
| Mobility (cm$^2$/Vs) | 18.5 | 15 | 11 | 4 | 1.1 | 10.2 |
| Carrier density (cm$^{-3}$) | $7.87 \times 10^{20}$ | $6.35 \times 10^{20}$ | $8.89 \times 10^{20}$ | $1.34 \times 10^{21}$ | $9.50 \times 10^{19}$ | $9.00 \times 10^{20}$ |
| X-ray diffraction (002) half width | 0.4265 | 0.4161 | 0.4232 | 0.4330 | 0.4282 | 0.4288 |
| X-ray diffraction (100) half width | 0.8820 | 0.8559 | 0.8442 | 0.8900 | 0.8750 | 0.8780 |
| c-Axis lattice const. | 5.2770 | 5.2354 | 5.2353 | 5.3200 | 5.2460 | 5.2479 |

TABLE 2

| | Sheet resistivity (Ω/square) | | | | | Anti-bend-effect property T3 = R3/R0 |
|---|---|---|---|---|---|---|
| | Initial: R0 | 60° C. day 7: R1 | T1 = (R1 − R0)/R0 | 60° C. 90% RH day 7: R2 | T2 = (R2 − R0)/R0 | |
| Ex. 1 | 70 | 88 | 0.26 | 280 | 3.00 | 15.5 |
| Ex. 2 | 38 | 43 | 0.13 | 110 | 1.89 | 18.6 |
| Ex. 3 | 45 | 50 | 0.11 | 105 | 1.33 | 20.7 |
| Ex. 4 | 120 | 135 | 0.13 | 230 | 0.92 | 12.3 |
| Ex. 5 | 650 | 780 | 0.20 | 1400 | 1.15 | 28.7 |
| Ex. 6 | 35 | 42 | 0.20 | 90 | 1.57 | 33.1 |
| Ex. 7 | 35 | 40 | 0.14 | 65 | 0.86 | 29.5 |
| Ex. 8 | 38 | 43 | 0.13 | 110 | 1.89 | 38.5 |
| Comp. Ex. 1 | 60 | 540 | 8.00 | 560 | 8.33 | 90.5 |
| Comp. Ex. 2 | 600 | 900 | 0.50 | 4300 | 6.17 | 29.1 |
| Comp. Ex. 3 | 2300 | 3600 | 0.57 | 18900 | 7.22 | 33 |
| Comp. Ex. 4 | 68 | 1500 | 21.06 | 13000 | 190.18 | 28.7 |

In all Examples, the zinc-oxide-based conductive stacked structure 1 exhibited a total light transmittance of 70% or higher and a haze of 10% or lower, indicating sufficient transparency. In addition, in all Examples, the transparent conductive film 13 was found to have a carrier density of $2.0 \times 10^{20}$ to $9.8 \times 10^{20}$ cm$^{-3}$. Furthermore, in all Examples, the transparent conductive film 13 exhibited an initial (after film formation) sheet resistivity R0 of 700 Ω/square or lower, and a change ratio in sheet resistivity T1 of 1.0 or less and a change ratio in sheet resistivity T2 of 4 or less after placement under high-moisture and high-temperature conditions. Meanwhile, when the change ratio in sheet resistivity T2 is higher than 4 (rating in the Examples), the stacked structure tends to lack durability in practical use. Comparative Example 1, in which the transparent conductive film was formed via one operation, was compared with Example 6, in which the transparent conductive film 13 was formed via a plurality of repetitions. In Example 6, the thermal load applied to the substrate 11 was reduced, whereby deterioration of the substrate 11 was satisfactorily prevented, and no deformation, no warpage, or no cracking was observed in the transparent conductive film 13. As compared with Comparative Example 1, Example 6 was found to be significant in terms of change ratio in sheet resistivity and anti-bend-effect property.

Example 6, Example 8, and Comparative Example 1, in which the transparent conductive film was formed under the same conditions via different times of film formation operations, were compared with one another in terms of X-ray diffraction. In Examples 6 and 8, through a plurality of repetitions of film formation operations, the transparent conductive film 13 was formed of a plurality of transparent conductive layers formed from a zinc-oxide-based conductive material. The c-axis lattice constant was comparatively larger than that measured in Comparative Example 1, and T3 was smaller, indicating that the anti-bend-effect property was enhanced. The a-axis lattice constant was found to be substantially constant regardless of the number of repetitions of form formation operations for forming the transparent conductive film 13. Although strain of the crystal structure, lattice defects, and other factors must be taken into consideration, the c-axis lattice constant of the transparent conductive film 13 possibly determines the anti-bend-effect property.

Comparative Example 4, in which no undercoat layer was provided, was compared with Examples 1 to 6. As a result, provision of the undercoat layer 12 was found to enhance stability of sheet resistivity after moisture and heat test.

Comparative Examples 2 and 3 were compared with Examples 1 to 6. In Examples 1 to 6, in which the carrier density fell within a specific range ($2.0 \times 10^{20}$ to $9.8 \times 10^{20}$ cm$^{-3}$), the sheet resistivity was low, the change ratio in sheet resistivity was small, and moisture resistance was excellent. In contrast, in Comparative Example 2, the change ratio in sheet resistivity was large, and the moisture resistance was poor. In Comparative Example 3, the initial sheet resistivity was high, the change ratio in sheet resistivity was large, and the moisture resistance was poor.

From the results of the Examples and the Comparative Examples, the target zinc-oxide-based conductive stacked structure 1 was found to be produced by forming the transparent conductive film 13 having a carrier density falling within a specific range from a plurality of transparent conductive layers made from a zinc-oxide-based conductive material and providing the undercoat layer 12.

INDUSTRIAL APPLICABILITY

The zinc-oxide-based conductive stacked structure of the present invention can be suitably employed as a flexible display surface as well as an electrode of semiconductor devices such as solar cells, organic transistors, and thermoelectric conversion devices.

According to the method for producing a zinc-oxide-based conductive stacked structure of the present invention, a zinc-oxide-based conductive stacked structure having excellent moisture resistance and anti-bend-effect property can be provided.

DESCRIPTION OF REFERENCE NUMERALS

1 Zinc-oxide-based conductive stacked structure
11 Substrate
12 Undercoat layer
13 Transparent conductive film

The invention claimed is:
1. A zinc-oxide-based conductive stacked structure comprising a substrate and, formed on at least one surface of the substrate, an undercoat layer and a transparent conductive film, wherein;
the transparent conductive film is formed of a plurality of transparent conductive layers formed from a zinc-oxide-based conductive material and has a carrier density of $2.0 \times 10^{20}$ to $9.8 \times 10^{20}$ cm$^{-3}$, and that
the zinc-oxide-based conductive stacked structure exhibits a change ratio in sheet resistivity of 50 or less, after bending of the stacked structure around a round bar having a diameter of 15 mm, with the transparent conductive film facing inward, wherein each transparent conductive layer has a thickness of 50 nm or less, and the zinc-oxide-based conductive stacked structure is obtained by forming, on the undercoat layer through ion plating, a plurality of transparent conductive layers formed from a zinc-oxide-based conductive material, to thereby form the transparent conductive film.

2. The zinc-oxide-based conductive stacked structure according to claim 1, wherein the transparent conductive film has a thickness of 50 to 250 nm.

3. The zinc-oxide-based conductive stacked structure according to claim 1, which exhibits an initial sheet resistivity R0 of 700 Ω/square or lower and which exhibits a first change ratio in sheet resistivity represented by $T1=(R1-R0)/R0$ of 1.0 or less and a second change ratio in sheet resistivity represented by $T2=(R2-R0)/R0$ of 4.0 or less, wherein R1 represents sheet resistivity after the stacked structure has been placed under 60° C. conditions for seven days, and R2 represents sheet resistivity after the stacked structure has been placed under 60° C.-90% RH conditions for seven days.

4. The zinc-oxide-based conductive stacked structure according to claim 1, wherein the zinc-oxide-based conductive stacked structure is formed by:

forming the undercoat layer on the substrate.

5. The zinc-oxide-based conductive stacked structure according to claim 1, wherein when forming the transparent conductive film, oxygen and argon are fed to a film-formation chamber at a ratio of oxygen gas flow rate to argon gas flow rate of 1:39 to 1:1.

6. The zinc-oxide-based conductive stacked structure according to claim 1, wherein the substrate has a total light transmittance of 70% or higher and a haze of 10% or lower.

7. The zinc-oxide-based conductive stacked structure according to claim 1, wherein the undercoat layer has a thickness of 0.01 to 20 μm.

8. The zinc-oxide-based conductive stacked structure according to claim 1, wherein the transparent conductive film has a zinc oxide content of 85 mass % or higher.

9. The zinc-oxide-based conductive stacked structure according to claim 1, wherein the transparent conductive film has 0.05 to 15 mass % of an additive selected from the group consisting of aluminum, gallium, boron, silicon, tin, indium, germanium, antimony, iridium, rhenium, cerium, zirconium, scandium, and yttrium.

10. The zinc-oxide-based conductive stacked structure according to claim 1, wherein the transparent conductive film has a lattice constant of a c axis of 5.23 to 5.25 Å.

11. An electronic device comprising the zinc-oxide-based conductive stacked structure as recited in claim 1.

12. A zinc-oxide-based conductive stacked structure comprising a substrate and, formed on at least one surface of the substrate, an undercoat layer and a transparent conductive film, wherein;

the transparent conductive film is formed of a plurality of transparent conductive layers formed from a zinc-oxide-based conductive material and has a carrier density of $2.0 \times 10^{20}$ to $9.8 \times 10^{20}$ cm$^{-3}$, and that the zinc-oxide-based conductive stacked structure exhibits a change ratio in sheet resistivity of 50 or less, after bending of the stacked structure around a round bar having a diameter of 15 mm, with the transparent conductive film facing inward, wherein each transparent conductive layer has a thickness of 50 nm or less, the zinc-oxide-based conductive stacked structure is obtained by forming, on the undercoat layer through ion plating, a plurality of transparent conductive layers formed from a zinc-oxide-based conductive material, to thereby form the transparent conductive film, and the transparent conductive film has a total light transmittance of 70% or higher and a haze of 10% or lower.

13. The zinc-oxide-based conductive stacked structure according to claim 1, wherein the transparent conductive film has a total light transmittance of 80% or higher and a haze of 5.2% or lower.

14. The zinc-oxide-based conductive stacked structure according to claim 1, wherein each transparent conductive layer has a thickness of 30 nm or less.

* * * * *